United States Patent [19]
Inaba

[11] Patent Number: 5,809,634
[45] Date of Patent: Sep. 22, 1998

[54] METHOD OF MANUFACTURING MAGNETIC HEAD SUSPENSION HAVING CIRCUIT WIRING PATTERN

[75] Inventor: Masaichi Inaba, Ushiku, Japan

[73] Assignee: Nippon Mektron, Ltd., Tokyo-To, Japan

[21] Appl. No.: 848,831

[22] Filed: May 5, 1997

[30] Foreign Application Priority Data

May 14, 1996 [JP] Japan .................................. 8-118998

[51] Int. Cl.$^6$ ...................................................... G11B 5/42
[52] U.S. Cl. ........................... 29/603.04; 216/52; 216/94; 360/103; 360/104
[58] Field of Search ........................... 29/603.04, 603.05, 29/603.06, 603.01; 360/103, 104; 216/75, 94, 100, 52

[56] References Cited

U.S. PATENT DOCUMENTS 5,666,717 9/1997 Inaba ...................................... 29/603.12

Primary Examiner—Carl E. Hall
Attorney, Agent, or Firm—Foley & Lardner

[57] ABSTRACT

A method of manufacturing a magnetic head suspension having a circuit wiring pattern member, comprises the steps of: preparing a laminated plate composed of a flat flexible insulating base member (2), a conductive layer (9 or 3) formed on one surface thereof, and an elastic metal layer (8 or 1) formed on the other surface thereof; photo-etching the conductive layer of the laminated plate, to form a metal mask (9) of a desired flexible insulating base member shape; removing the exposed flexible insulating base member (2) to such a thickness that the elastic metal layer (8 or 1) is at least not exposed; photo-etching the formed metal mask (9), to form a desired circuit wiring pattern (3); further etching the flexible insulating base member (2), to remove a part of the flexible insulating base member (2) still remaining on the surface of the elastic metal layer (8 or 1) in the preceding step, by using the formed circuit wiring pattern (3) as a mask; forming a surface protecting layer (4) on the surface of the formed circuit wiring pattern (3) and photo-etching the elastic metal layer (8) and bending the photo-etched elastic metal layer (8) to a desired shape, to form a suspension (1) of a desired shape.

3 Claims, 2 Drawing Sheets

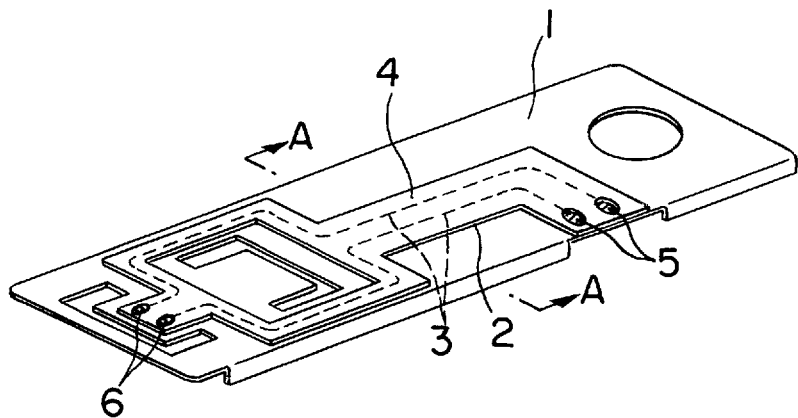
F I G. 1
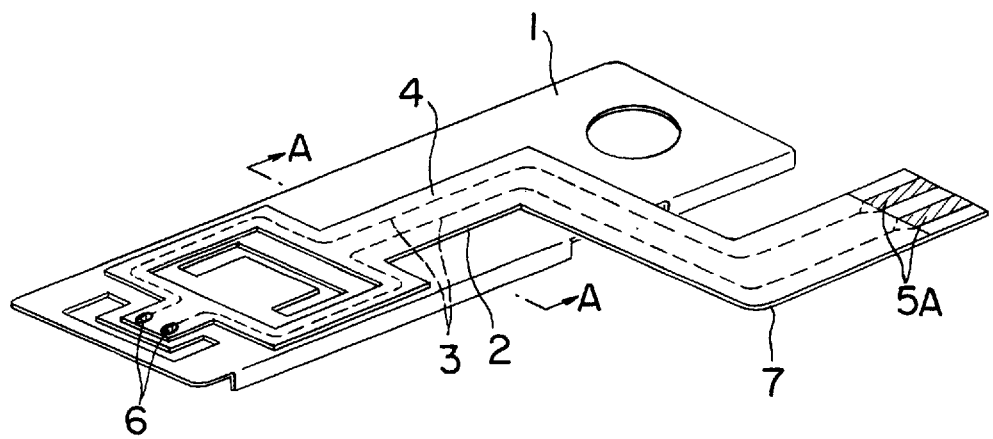
F I G. 2
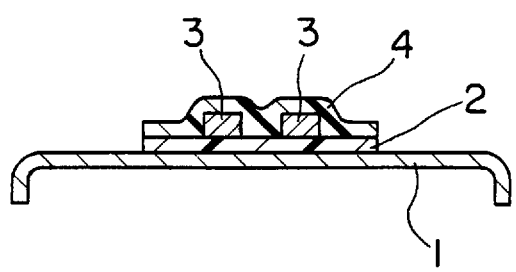
F I G. 3

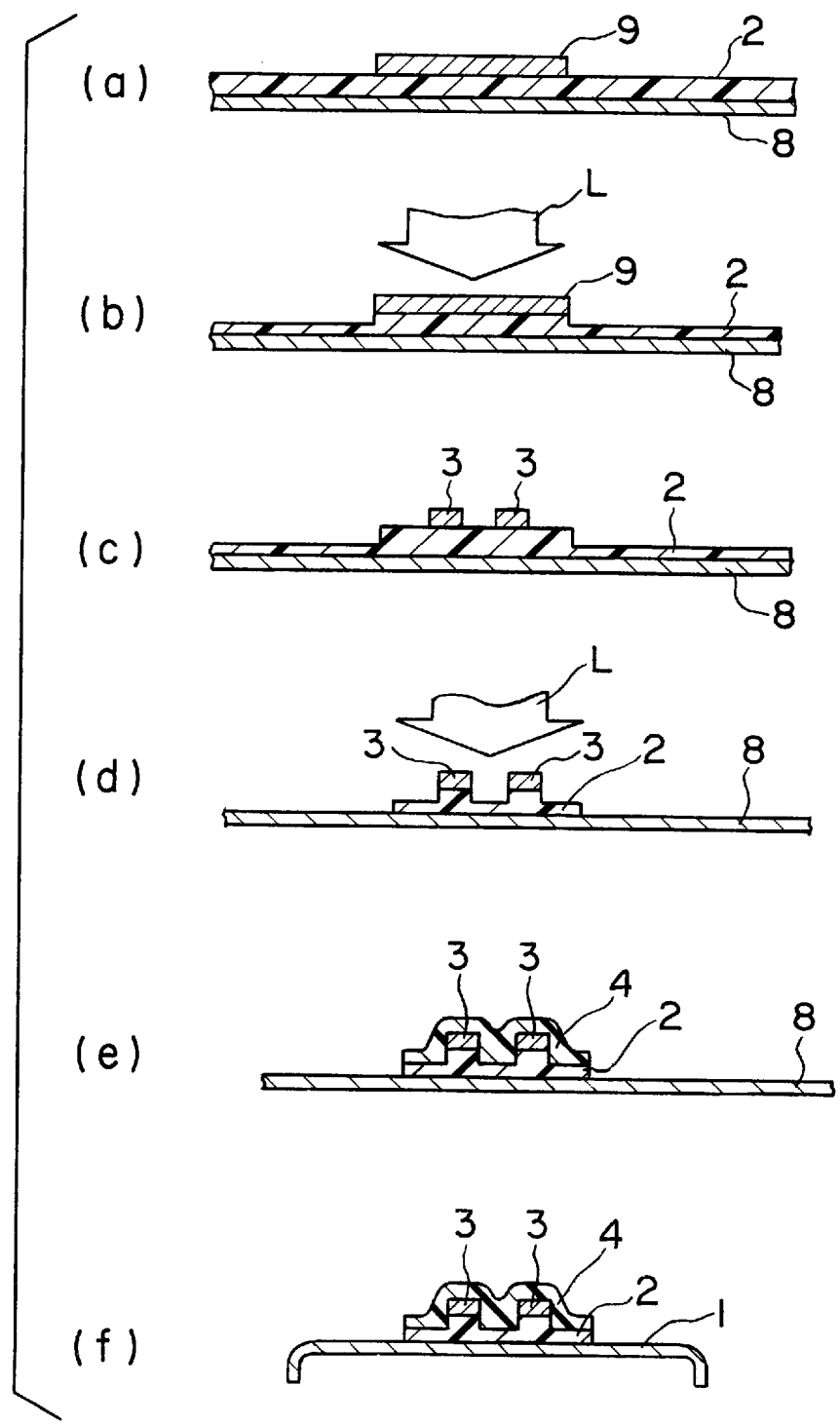
F I G. 4

METHOD OF MANUFACTURING MAGNETIC HEAD SUSPENSION HAVING CIRCUIT WIRING PATTERN

BACKGROUND OF THE INVENTION

1. Field of the Invention

The present invention relates to a method of manufacturing a magnetic head suspension assembly used for a magnetic disk apparatus, for instance, and more specifically to a method of manufacturing a magnetic head suspension having a circuit wiring pattern member, in which the circuit wiring pattern member for connecting a magnetic head element to a read-write amplifier circuit board is formed integral with the suspension.

2. Description of the Prior Art

The magnetic disk apparatus of the type as described above is usually composed of at least one rotary disk for recording data magnetically, a magnetic head element for reading or writing data from or to each track formed on the rotary disk, and a head locating actuator connected to the magnetic head element for moving the magnetic head element to any desired track position and for maintaining the same magnetic head element over the track of the rotary disk.

An example of prior art magnetic head suspension assembly is disclosed in Japanese Patent Publication before examination (Kokai) No. 63-113917, in which the magnetic head suspension assembly is composed of a mount, a load beam, and a flexure. The magnetic head element is mounted on the flexure by use of an epoxy resin, and the flexure is connected to the load beam by use of laser welding, for instance. Further, a gold-plated copper wire covered with polyurethane is connected to an electrode formed on the magnetic head element by use of ultrasonic welding or soldering, as a lead-out wiring portion. Further, after has been turned by a predetermined number of times, the wiring member is housed in a flexible insulating resin tube, and then mounted on the suspension by caulking a part of the suspension, for instance.

In the prior art magnetic head suspension assembly as described above, when the lead-out wire is connected to the electrode on the magnetic head element, since the connecting workability is severely restricted, the assembling work is not effective, so that the productivity cannot be improved. Further, recently, since there exists such a tendency that the magnetic head element is further small-sized and the number of terminals is further increased, this problem has become serious. In addition, since the rigidity of the lead-out wiring member exerts a harmful influence upon the floating characteristics of the magnetic head element, it has been difficult to obtain an optimum floating position or condition. In addition, since the lead-out wiring member is subjected to air pressure due to the air flow caused by the rotating recording medium, there exists another problem in that a harmful influence is exerted upon the floating position of the magnetic head element.

To overcome these problems, various methods have been so far proposed. For instance, Japanese Patent Publication before examination (Kokai) No. 53-74414 discloses such a method that a flexible circuit board used in common for both the lead-out wiring member and the suspension is used as a supporting mechanism of the magnetic head element. In this method, however, since there are various problems with respect to the original requirements for the suspension mechanism such that the magnetic head element must be located accurately; an appropriate load must be applied; and a correct floating position must be secured, it is difficult to adopt this method in the recent high-density magnetic disk apparatus.

Therefore, in general, in order to solve the problem related to the lead-out wires, a method has been so far proposed such that the lead-out wires are connected together by use of a flexible circuit board and the circuit board is bonded onto the suspension spring by use of an adhesive, for instance.

In this method, however, with increasing speed of the seek operation, in the case where the suspension is considered as having a function as a mechanical element of a servo-system, it is necessary to reduce the weight of the suspension as a composing member of the servo-system. Therefore, in the above-mentioned method such that the flexible circuit board is bonded onto the suspension spring, there arises a problem in that the weight of the suspension is inevitably increased to improve the connecting workability.

Therefore, recently, a suspension formed integral with a predetermined circuit wiring pattern via a flexible insulating base member has been proposed, as disclosed in Japanese Patent Application No. 6-193662.

SUMMARY OF THE INVENTION

With these problems in mind, therefore, it is the object of the present invention to provide a method of manufacturing a magnetic head suspension having a circuit wiring pattern member, by which the lead-out wiring member for a magnetic head element is formed integral with the suspension.

To achieve the above-mentioned object, the present invention provides a method of manufacturing a magnetic head suspension having a circuit wiring pattern member, comprising the steps of: preparing a laminated plate composed of a flat flexible insulating base member, a conductive layer formed on one surface thereof, and an elastic metal layer formed on the other surface thereof; photo-etching the conductive layer of the laminated plate, to form a metal mask of a desired flexible insulating base member shape; removing the exposed flexible insulating base member to such a thickness that the elastic metal layer is at least not exposed; photo-etching the formed metal mask, to form a desired circuit wiring pattern; further etching the flexible insulating base member, to remove a part of the flexible insulating base member still remaining on the surface of the elastic metal layer in the preceding step, by using the formed circuit wiring pattern as a mask; forming a surface protecting layer on the surface of the formed circuit wiring pattern; and photo-etching the elastic metal layer and bending the photo-etched elastic metal layer to a desired shape, to form a suspension of a desired shape.

Further, it is preferable that in the step of removing the exposed flexible insulating base member to such a thickness that the elastic metal layer is at least not exposed, any one of etching methods of using an excimer laser, plasma etching, and resin etching is adopted.

Further, it is preferable that in the step of forming a surface protecting layer on the surface of the formed circuit wiring pattern, a photo-sensitive insulating resin is applied, exposed, developed, and cured.

BRIEF DESCRIPTION OF THE DRAWINGS

FIG. 1 is a perspective view showing a magnetic head suspension having a circuit wiring pattern member, manufactured by the method according to the present invention;

FIG. 2 is a perspective view showing a modification of the magnetic head suspension having a circuit wiring pattern member, manufactured by the method according to the present invention;

FIG. 3 is a cross-sectional view showing the magnetic head suspension having a circuit wiring pattern member, taken along the line A—A shown in FIG. 1 or FIG. 2; and FIGS. 4(a) to 4(f) are cross-sectional views, for assistance in explaining the manufacturing steps of the magnetic head suspension having a circuit wiring pattern member according to the present invention.

DETAILED DESCRIPTION OF THE EMBODIMENTS

FIGS. 1 and 2 show the magnetic head suspension having a circuit wiring pattern member manufactured in accordance with the method according to the present invention.

In FIGS. 1 and 2, a suspension used for a magnetic head is formed integral with a wiring pattern member for connecting a magnetic head element to a read/write amplifier circuit board.

In more detail, the magnetic head suspension having a circuit wiring member shown in FIG. 1 is composed of a suspension 1 formed of an elastic metal (e-g., stainless steel), a flexible insulating base member 2 formed on the suspension 1, and a circuit wiring pattern 3 (shown by dashed lines) formed on the insulating base member 2, and a surface protecting layer 4 for covering the circuit wiring pattern 3. Further, four terminals 5 and 6 to be connected to the other elements are formed on the suspension 1. The surfaces of these terminals 5 and 6 are all covered with solder or gold. Therefore, when leads are soldered to these terminals 5 and 6, it is possible to connect the suspension 1 to the other elements.

Further, FIG. 2 shows a modification of the magnetic head suspension having a circuit wiring pattern member shown in FIG. 1. In this modification, the flexible insulating base member 2 is formed with an extension portion 7 extending horizontally outward from the upper surface of the suspension 1. Further, in the same way as with the case shown in FIG. 1, a circuit wiring pattern 3 (dashed lines) is formed on the flexible insulating base member 2 and further covered with the surface protecting layer 4. Further, two terminals 5A to be connected to other elements are formed at one end of the circuit wiring pattern 3 and on the extension portion 7 of the insulating base member 2, without being covered with the surface protecting layer 4.

FIG. 3 is a cross-sectional view of the magnetic head suspension, taken along the line A—A in FIG. 1 or FIG. 2. In FIG. 3, the flexible insulating base member 2 having an appropriate width and formed of a resin (e.g., polyimide resin, epoxy resin, acrylic resin, etc.) is formed on the upper surface of the suspension 1. Further, a desired circuit wiring pattern 3 is formed on the upper surface of the flexible insulating base member 2. Further, a surface protecting layer 4 formed of light sensitive insulating resin, for instance is formed on the surface of the circuit wiring pattern 3.

The method of manufacturing the magnetic head suspension having a circuit wiring member according to the present invention will be explained hereinbelow with reference to FIGS. 4(a) to 4(f). FIGS. 4(a) to 4(f) are cross-sectional views taken along the same line A—A shown in FIG. 1 or FIG. 2, in the same way as with the case of FIG. 3.

Further, in the method described hereinbelow, although etching using an excimer laser is adopted to remove the resin, it is of course possible to use physical etching (including plasma etching) or chemical etching (strong alkali chemical such as hydrazine).

First, as shown in FIG. 4(a), a laminated plate is prepared, which is composed of a flat flexible insulating base member 2 formed of polyimide resin, epoxy resin, acrylic resin, etc., an elastic metal layer 8 (e.g., stainless steel) for constructing the suspension and formed on the lower surface of the base member 2, and a conductive layer (e.g., copper foil) formed on the upper surface of the base member 2. Further, the conductive layer laminated on the upper surface of the base member 2 is photo-etched to form a metal mask 9, which matches a desired shape of the base member 2. The formed metal mask 9 is used to shade the excimer laser. Here, it is preferable to use a non-adhesive type laminated layer having no adhesive between the base member 2 and the conductive layer, form the standpoint of flexibility of the suspension 1 (i.e., the elastic metal layer 8). However, it is also possible to use the base member 2 laminated with the conductive layer by use of an adhesive therebetween. In the following manufacturing process, the non-adhesive type laminated base member 2 is used.

Further, as shown in FIG. 4(b), the excimer layer L is radiated upon the base member 2 from the metal mask 9 side, to remove the exposed insulating base member 2 to such a thickness that at least the elastic metal layer 8 (i.e., the suspension 1) is not exposed. To remove the insulating, base member 2, it is also possible to use plasma etching, the resin etching, etc. without being limited only to the excimer laser etching.

Further, as shown in FIG. 4(c), the metal mask 9 is photo-etched to form a desired wiring pattern 3.

Further, as shown in FIG. 4(d), the flexible insulating base member 2 is further etched by use of the circuit wiring pattern 3 as a mask, to remove the base member 2 a part of which still remains on the surface of the elastic metal layer 8 in the preceding process.

Further, as shown in FIG. 4 (e), the surface protecting layer 4 is formed on the circuit wiring pattern 3, by a series of steps such that a photo-sensitive insulating resin is applied thereonto; the applied resin is exposed to light and then developed; and further the developed resin is cured, etc.

Further, as shown in FIG. 4(f), the elastic metal layer 8 is photoetched and then bent to a desired bent angle to form the suspension 1.

In the method of manufacturing of the magnetic head suspension having a circuit wiring pattern member as described above, since the suspension and the circuit wiring pattern member can be formed integral with each other, it is unnecessary to bond a flexible circuit board to the suspension, being different from the prior art suspension, so that it is possible to solve the problem such that the weight of the suspension is inevitably increased to improve the workability of the suspension.

Further, in the manufacturing method according to the present invention, since it is possible to form the metal mask 9 for shading the laser, by first etching the conductive layer (used to form the circuit wiring pattern 3), it is possible to eliminate the process of forming another light shading mask or a resist layer. In addition, when the metal mask 9 is etched to form the circuit wiring pattern 3, since the insulating base member 2 slightly remaining on the elastic metal layer 8 (i.e., suspension 1) can be used as an etching protecting film for the elastic metal layer 8, it is possible to use the acid etching chemical the same as used to etch the elastic metal layer 8, so that the manufacturing process of the suspension can be facilitated.

Further, since the circuit wiring pattern can be used as a mask, when the etching protecting film for the elastic metal layer 8 is removed, it is unnecessary to form another mask or another resist.

As described above, in the method of manufacturing the magnetic head suspension having the circuit wiring pattern member according to the present invention, it is possible to realize a magnetic head suspension having a circuit wiring pattern member of light-weight and high-workability, without deteriorating the original function required for the suspension.

What is claimed is:

1. A method of manufacturing a magnetic head suspension having a circuit wiring pattern member, comprising the steps of:

preparing a laminated plate composed of a flat flexible insulating base member, a conductive layer formed on one surface thereof, and an elastic metal layer formed on the other surface thereof;

photo-etching the conductive layer of the laminated plate, to form a metal mask of a desired flexible insulating base member shape;

removing the exposed flexible insulating base member to such a thickness that the elastic metal layer is at least not exposed;

photo-etching the formed metal mask, to form a desired circuit wiring pattern;

further etching the flexible insulating base member, to remove a part of the flexible insulating base member still remaining on the surface of the elastic metal layer in the preceding step, by using the formed circuit wiring pattern as a mask;

forming a surface protecting layer on the surface of the formed circuit wiring pattern; and photo-etching the elastic metal layer and bending the photo-etched elastic metal layer to a desired shape, to form a suspension of a desired shape.

2. The method of manufacturing a magnetic head suspension having a circuit wiring pattern member of claim 1, wherein in the step of removing the exposed flexible insulating base member to such a thickness that the elastic metal layer is at least not exposed, any one of etching methods of using an excimer laser, plasma etching, and resin etching is adopted.

3. The method of manufacturing a magnetic head suspension having a circuit wiring pattern member of claim 1, wherein in the step of forming a surface protecting layer on the surface of the formed circuit wiring pattern, a photosensitive insulating resin is applied, exposed, developed, and cured.

* * * * *